(12) United States Patent
Lloyd (10) Patent No.: US 11,108,403 B2
(45) Date of Patent: Aug. 31, 2021

(54) DEVICE AND METHOD FOR EFFICIENT DIGITAL-ANALOG CONVERSION

(71) Applicant: Rohde & Schwarz GmbH & Co. KG, Munich (DE)

(72) Inventor: Gareth Lloyd, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 15/949,455

(22) Filed: Apr. 10, 2018

(65) Prior Publication Data
US 2018/0302099 A1 Oct. 18, 2018

Related U.S. Application Data (60) Provisional application No. 62/485,192, filed on Apr. 13, 2017.

(51) Int. Cl.
*H03F 1/26* (2006.01)
*H03M 1/08* (2006.01)
(Continued)

(52) U.S. Cl.
CPC ............. *H03M 1/08* (2013.01); *H03F 1/0288* (2013.01); *H03F 1/56* (2013.01); *H03F 3/24* (2013.01);
(Continued)

(58) Field of Classification Search
CPC .. H03F 1/0288; H03F 3/602; H03F 2200/451; H03F 3/245; H03F 3/24;
(Continued)

(56) References Cited

U.S. PATENT DOCUMENTS 1,686,792 A 10/1928 Black
5,760,646 A 6/1998 Belcher et al.
(Continued)

FOREIGN PATENT DOCUMENTS

WO WO2017031581 A1 3/2017
WO WO2017037744 A2 3/2017

OTHER PUBLICATIONS

Analog Devices, "Sigma-Delta ADCs and DACs", Analog Devices, Application Note AN-283.

*Primary Examiner* — Linh V Nguyen
(74) *Attorney, Agent, or Firm* — Potomac Technology Law, LLC (57) ABSTRACT

A device for converting a digital input signal into an analog output signal is provided. The device includes a first digital to analog converter configured to generate a first analog signal, and a second digital to analog converter configured to generate a second analog signal. The device further includes a signal splitter configured to couple out a feedback signal from the second analog signal. The device further includes a first signal combiner configured to subtract the feedback signal from the first analog signal to generate an error signal. The device further includes an amplifier configured to amplify the error signal, resulting in an amplified error signal. The device further includes a second signal combiner configured to combine the amplified error signal and a signal derived from the second analog signal, resulting in the analog output signal.

17 Claims, 5 Drawing Sheets

(51) Int. Cl.
  *H03M 1/06* (2006.01)
  *H03M 1/66* (2006.01)
  *H03F 1/56* (2006.01)
  *H03F 3/24* (2006.01)
  *H03F 3/60* (2006.01)
  *H03F 1/02* (2006.01)

(52) U.S. Cl.
  CPC .............. *H03F 3/245* (2013.01); *H03F 3/602* (2013.01); *H03M 1/0675* (2013.01); *H03M 1/662* (2013.01)

(58) Field of Classification Search
  CPC .......... H03F 1/3247; H03F 1/56; H03F 3/211; H03M 1/08; H03M 1/0675; H03M 1/662
  USPC ..................... 341/139, 140, 132; 330/50, 151
  See application file for complete search history.

(56) References Cited

U.S. PATENT DOCUMENTS

| | | | |
|---|---|---|---|
| 6,094,458 A | 7/2000 | Hellberg | |
| 6,359,508 B1 | 3/2002 | Mucenieks | |
| 6,683,495 B2 * | 1/2004 | Johnson | H03F 1/3229 330/124 R |
| 7,440,733 B2 * | 10/2008 | Maslennikov | H03F 1/0227 330/10 |
| 7,642,850 B2 * | 1/2010 | Martin | H03F 1/3229 330/151 |
| 9,219,453 B2 * | 12/2015 | Ahmed | H03F 1/0288 |
| 2002/0048326 A1 * | 4/2002 | Sahlman | H03F 1/3229 375/297 |
| 2004/0266366 A1 * | 12/2004 | Robinson | H03F 1/3241 455/91 |
| 2005/0017800 A1 * | 1/2005 | Robinson | H03F 1/3223 330/149 |
| 2005/0017802 A1 * | 1/2005 | Robinson | H03F 1/3223 330/151 |
| 2008/0111622 A1 * | 5/2008 | Sperlich | H03F 1/3241 330/124 R |
| 2009/0251195 A1 * | 10/2009 | Ahmed | H03F 1/3247 327/334 |
| 2010/0265112 A1 * | 10/2010 | Ek | H03M 1/0678 341/144 |
| 2013/0162349 A1 * | 6/2013 | Gao | H03F 1/3241 330/75 |
| 2017/0041012 A1 | 2/2017 | Cao et al. | |
| 2017/0041019 A1 | 2/2017 | Miglani et al. | |
| 2017/0077936 A1 | 3/2017 | Kao | |
| 2017/0141739 A1 * | 5/2017 | Arnaud | H03F 3/19 |

* cited by examiner

DEVICE AND METHOD FOR EFFICIENT DIGITAL-ANALOG CONVERSION

RELATED APPLICATIONS

This application claims the benefit of the earlier filing date under 35 U.S.C. § 119(e) from U.S. Provisional Application Ser. No. 62/485,192 (filed 2017 Apr. 13), which is incorporated herein by reference in its entirety.

TECHNICAL FIELD

The invention relates to generating a high power analog output signal from a digital input signal, such as a high-frequency output signal.

BACKGROUND

When generating high power output signals from digital input signals, there exists so far a trade-off between signal quality, signal power and signal generation efficiency. While conventional solutions like Doherty amplifiers achieve a high signal quality, the signal generation efficiency is sub-optimal. On the other hand, when using switching converters, a very high signal generating efficiency is achieved, while at the same time, the signal quality is sub-optimal.

For example, the US patent publication no. 20170041019A1 shows such a conventional converter.

Accordingly, there is a need for an approach for converting a digital input signal into an analog output signal, which achieve a high output signal power, a high output signal quality, and a high signal generation efficiency at the same time.

Some Example Embodiments

Embodiments of the present invention advantageously address the foregoing requirements and needs, as well as others, by providing a device and method for converting a digital input signal into an analog output signal, which achieve a high output signal power, a high output signal quality, and a high signal generation efficiency at the same time.

According to a first aspect of the invention, a device for converting a digital input signal into an analog output signal is provided. The device comprises a first digital to analog converter, which generates a first analog signal from the digital input signal, and a second digital to analog converter, which generates a second analog signal from the digital input signal. Moreover, the device comprises a signal splitter, which couples out a feedback signal from the second analog signal. A signal combiner is used for generating and error signal, by subtracting the feedback signal from the first analog signal.

By way of example, the error signal is amplified by an amplifier, resulting in an amplified error signal. The amplified error signal and a signal derived from the second analog signal are combined by a signal combiner, resulting in the analog output signal.

By using the efficient but error-prone second digital to analog converter for generating the bulk of the analog output signal, and merely using the inefficient, but accurate first digital to analog converter for correcting errors, it is possible to generate the analog output signal with a high efficiency, a high power, and a high quality.

According to a first implementation form of the first aspect, the second digital to analog converter has a higher output power than the first digital to analog converter. Additionally, the second digital to analog converter has a higher noise level and/or a higher distortion lever than the first digital to analog converter. It is thereby possible to increase the power output, the signal quality and the signal generation efficiency of the device.

According to a second implementation form of the first aspect, the signal combiner is configured for combining the amplified error signal and the signal derived from the second analog signal, so as to cancel out errors present in the signal derived from the second analog signal. This further increases the quality of the analog output signal.

According to a third implementation form of the first aspect, the signal combiners and/or the signal splitter are directional couplers. Each of the individual combiners or splitters can be a directional coupler on its own. This allows for a very simple implementation of the device.

According to a fourth implementation form of the first aspect, after coupling out the feedback signal from the second analog signal, a remaining second analog signal remains. The device comprises a delay element, which is configured to delay the remaining second analog signal, resulting in a delayed signal. The signal derived from the second analog signal is the delayed signal. By delaying the signal, it is possible to synchronize the signals through the two signal paths, leading to an exceptionally high output signal quality.

According to a fifth implementation form of the first aspect, the delay element is a bandpass filter or a transmission line or a cable. A very simple implementation of the delay element is thereby achieved.

According to a sixth implementation form of the first aspect, the delay element has an adjustable delay. The device is then configured to adjust the delay of the delay element so that it is identical to a delay of the amplified error signal with regard to the first analog signal. An especially accurate synchronization of the amplified signals of the two signal paths is thereby achieved.

According to a seventh implementation form of the first aspect, the device comprises a phase aligner, which is configured for adjusting the phase of the error signal. Additionally or alternatively, the device comprises an amplitude aligner, which is configured for adjusting the amplitude of the error signal or a signal derived from the error signal. It is thereby possible to adjust the error signal, so that the recombination of the amplified error signal and the signal derived from the second analog signal leads to an optimal analog output signal.

According to an eighth implementation form of the first aspect, the first digital to analog converter is a digital predistortion converter or a Doherty converter. This leads to a very high accuracy of the determined error signal.

According to a ninth implementation form of the first aspect, the second digital to analog converter is a sigma-delta modulator or a one bit digital to analog converter or a switched mode digital to analog converter. This leads to a very high efficiency of the signal generation.

According to a tenth implementation form of the first aspect, the digital input signal is a digital baseband signal or a modulated data stream. A very high flexibility of the device is thereby achieved.

According to a second aspect of the invention, a method for converting a digital input signal into an analog output signal is provided. The method comprises generating a first analog signal from the digital input signal, by a first digital to analog converter, generating a second analog signal from the digital input signal, by a second digital to analog converter, coupling out a feedback signal from the second analog signal, generating an error signal by subtracting the feedback signal from the first analog signal.

By way of example, the method comprises the steps of amplifying the error signal, resulting in an amplified error signal, and combining the amplified error signal and a signal derived from the second analog signal, resulting in the analog output signal.

By using the efficient but error-prone second digital to analog converter for generating the bulk of the analog output signal, and merely using the inefficient, but accurate first digital to analog converter for correcting errors, it is possible to generate the analog output signal with a high efficiency, a high power and a high quality.

According to a first implementation form of the second aspect, the second digital to analog converter has a higher output power than the first digital to analog converter. Additionally or alternatively, the second digital to analog converter has a higher noise level and/or a higher distortion level than the first digital to analog converter. It is thereby possible to increase the power output, the signal quality and the signal generation efficiency.

According to a second implementation form of the second aspect, the amplified error signal and the signal derived from the second analog signal are combined so as to cancel out errors present within the signal derived from the second analog signal. This allows for a very simple implementation.

According to a third implementation form of the second aspect, after coupling out the feedback signal from the second analog signal, a remaining second analog signal remains. The remaining second analog signal is delayed, resulting in a delayed signal. The signal derived from the second analog signal is the delayed signal. By delaying the signal, it is possible to synchronize the signals through the two signal paths, leading to an exceptionally high output signal quality.

According to a fourth implementation form of the second aspect, the delay is adjustable. The delay is adjusted so that it is identical to a delay of the amplified error signal with regard to the first analog signal. An especially accurate synchronization of the amplified signals of the two signal paths is thereby achieved.

According to a fifth implementation form of the second aspect, the phase of the error signal is adjusted. Additionally or alternatively, the amplitude of the error signal or a signal derived from the error signal is adjusted. It is thereby possible to adjust the error signal, so that the recombination of the amplified error signal and the signal derived from the second analog signal leads to an optimal analog output signal.

According to a sixth implementation form of the second aspect, the digital input signal is a digital baseband signal or a modulated data signal. A very high flexibility is thereby achieved.

BRIEF DESCRIPTION OF THE DRAWINGS

Embodiments of the present invention are illustrated by way of example, and not by way of limitation, in the figures of the accompanying drawings, in which like reference numerals refer to similar elements, and in which.

DETAILED DESCRIPTION

A device and method for converting a digital input signal into an analog output signal, which achieve a high output signal power, a high output signal quality, and a high signal generation efficiency at the same time, are described. In the following description, for the purposes of explanation, numerous specific details are set forth in order to provide a thorough understanding of the invention. It is apparent, however, that the invention may be practiced without these specific details or with an equivalent arrangement. In other instances, well-known structures and devices are shown in block diagram form in order to avoid unnecessarily obscuring the invention.

First, the general construction and function of different embodiments of the device for converting a digital input signal into an analog output signal are described with reference to FIG. 1 and FIG. 2. With reference to FIG. 3, the function of an embodiment of a method for converting a digital input signal into an analog output signal is then described. Then, with reference to FIG. 4 and FIG. 5, different achievable results, based on use of different embodiments of the device for converting a digital input signal into an analog output signal, are shown. Similar entities and reference numbers in different figures have been partially omitted.

Reference will now be made in detail to example embodiments of the present invention, examples of which are illustrated in the accompanying drawings. However, the following embodiments of the present invention may be variously modified and the range of the present invention is not limited by the following embodiments.

First Embodiment

Figure 1:
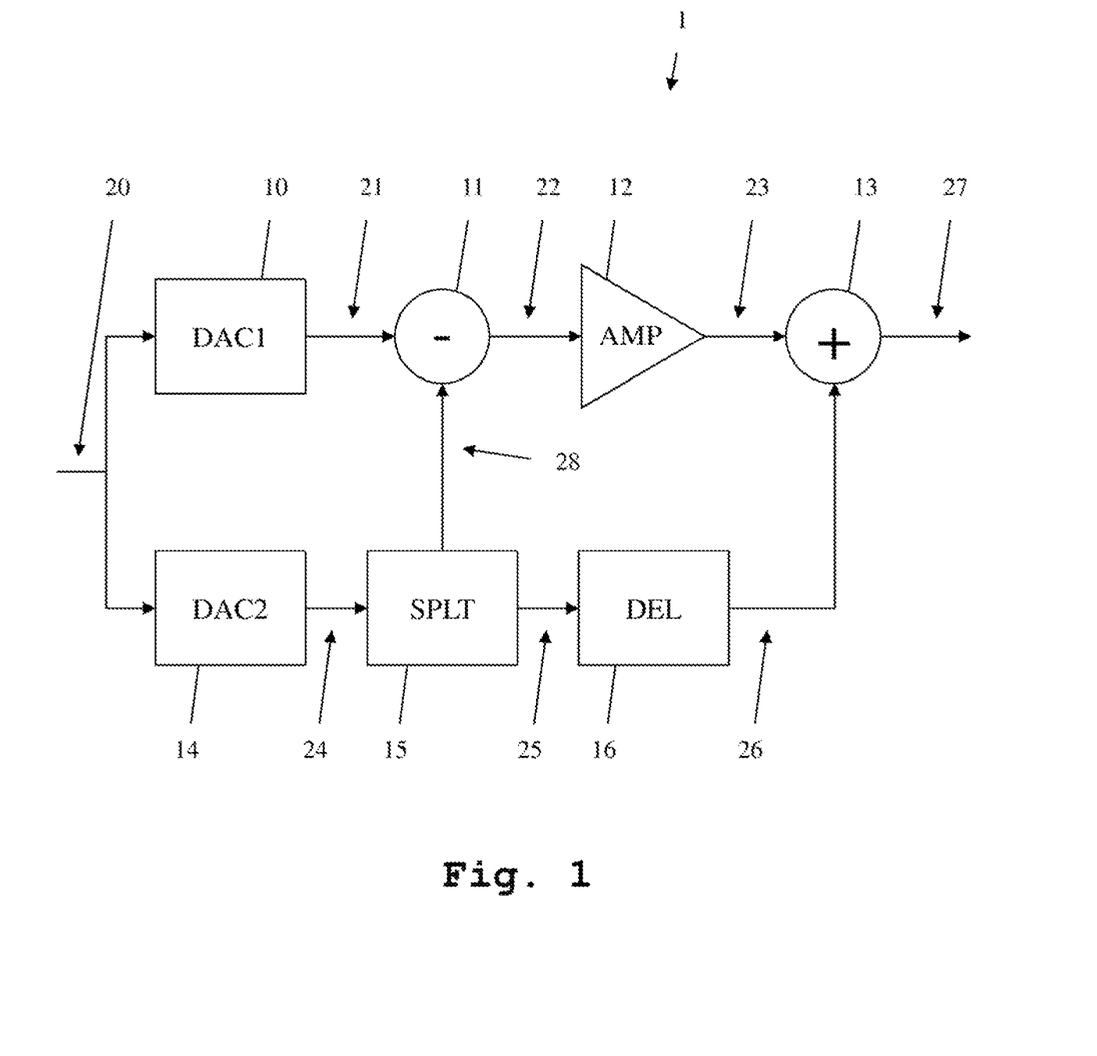
FIG. 1 shows a first example of a device for converting a digital input signal into an analog output signal, in accordance with example embodiments of the present invention.

In FIG. 1, a first example embodiment of a device 1 for converting a digital input signal 20 to an analog output signal 27 is shown. The device 1 comprises a first digital to analog converter 10, connected to a signal combiner 11, which in turn is connected to an amplifier 12. The amplifier 12 is moreover connected to a further signal combiner 13. Moreover, the device 1 comprises a second digital to analog converter 14, which is connected to a signal splitter 15, which is moreover connected to the signal combiner 11 and to a delay element 16. The delay element 16 is moreover connected to the signal combiner 13.

A digital input signal 20 is provided to the first digital to analog converter 10 and to the second digital to analog converter 14. The second digital to analog converter 14 is for example a one bit switched converter or is a sigma-delta modulator. It converts the digital input signal 20 to a second analog signal 24. the second analog signal 24 has a low signal quality, but a high signal power. Moreover, the second digital to analog converter 14 achieves a very high efficiency in generating the second analog signal 24. The second analog signal 24 is provided to the signal splitter 15, which couples out a feedback signal 28, which has a very low power with regard to the second analog signal 24. For example a power ratio of 1% of the second analog signal 24 is present within the feedback signal 28. A remaining signal 25 is handed to the delay element 16, which adds a time delay, resulting in a delayed signal 26. The delay element 16, for example is transmission line or a cable or a band pass filter. Advantageously, the delay is adjustable.

The first digital analog converter 10 generates a first analog signal 21, from the digital input signal 20. The first analog signal 21 has a high signal quality with regard to the second analog signal 24. At the same time though, the digital analog converter 10 achieves only a low output power and also only a low efficiency. The first digital analog converter 10 is for example a Doherty amplifier or a digital pre distortion converter.

The first analog signal 21 is handed to the signal combiner 11, which combines it with the feedback signal 28 in a subtractive manner. An error signal 22 is the result of this signal combining. The error signal 22 is passed on to the amplifier 12, which amplifies it, resulting in an amplified error signal 23. The amplified error signal 23 is also handed to the signal combiner 13, which additively combines it with the delayed signal 26, resulting in the analog output signal 27.

Since the majority of the power within the analog output signal 27 is generated by the efficient second digital to analog converter 14, and only a small minority of the output power of the analog output signal 27 is generated by the inefficient first digital to analog converter 10, in total, a high efficiency of generating the analog output signal 27 from the digital input signal 20 is achieved. Since the errors of the error-prone second digital to analog converter 14 are corrected, a high signal quality of the analog output signal 27 is achieved.

Second Embodiment

Figure 2:
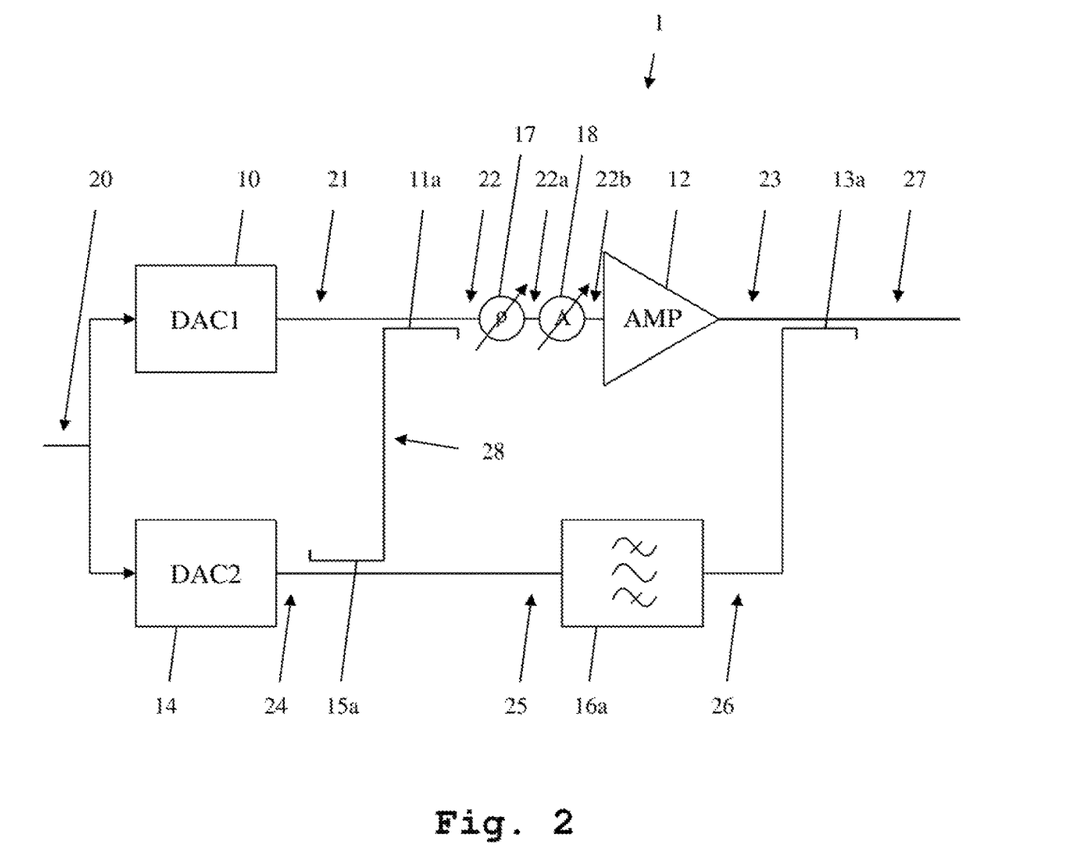
FIG. 2 shows a second example of a device for converting a digital input signal into an analog output signal, in accordance with example embodiments of the present invention.
Figure 3:
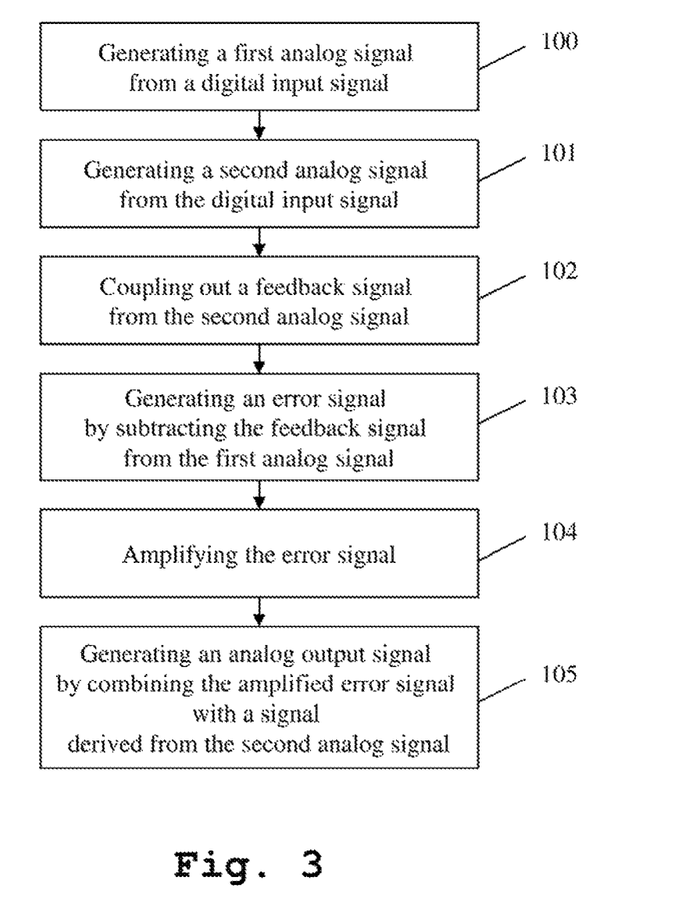
FIG. 3 shows a method for converting a digital input signal into an analog output signal, in accordance with example embodiments of the present invention.

In FIG. 2, a second example embodiment of a device 1 for converting a digital input signal 20 to an analog output signal 27 is shown. Here, the device 1 comprises a directional coupler 15a instead of the signal splitter 15. At the same time, it comprises a directional coupler 11a instead of the signal combiner 11. Moreover, it comprises a directional coupler 13a instead of the signal combiner 13a instead of the signal combiner 13. Also, the device 1, comprises a band pass filter 16a instead of the delay element 16 of FIG. 1. The before-mentioned elements perform the function of the corresponding elements, shown in FIG. 1. The alternatives shown here, function independently of one another. They can therefore be employed independently. This means that only one or more of these elements can be crafted in a fashion according to FIG. 1 or FIG. 2.

Additionally, in this embodiment, between the directional coupler 11a, functioning as a signal combiner and the amplifier 12, a phase adjuster 17 and an amplitude adjuster 18 are inserted. With these elements 17, 18, it is possible to adjust the amplitude and the phase of the error signal 22. In the embodiment shown here, the error signal 22 is provided to the phase adjuster 17, which adjusts the phase and outputs a phase adjusted signal 22a, which is handed to the amplitude adjuster 18. The amplitude adjuster 18 adjusts the amplitude and hands an amplitude adjusted signal 22b to the amplifier 12. We point out though, that the order of the phase adjuster 17 and the amplitude adjuster 18 is arbitrary and can be easily be reversed.

Adjusting the phase and the amplitude of the error signal 22 makes it possible to even further increase the quality of the analog output signal, since the exact timing as well as the exact magnitude of the error signal, which is combined with the remaining signal 26 can be controlled to optimally match.

The amplitude adjuster 18 might also be implemented as an adjustable gain of the amplifier 12.

Embodiment of the Method

In FIG. 3, an embodiment of a method for converting a digital input signal into an analog output signal is shown as a flow diagram.

In a first step 100, a first analog signal is generated from a digital input signal. In a second step 101, a second analog signal is generated from the digital input signal. In a third step 102 a feedback signal is coupled out from the second analog signal. In a fourth step 103 an error signal is generated by subtracting the feedback signal from the first analog signal. In a fifth step 104, the error signal is amplified. In a final sixth step 105, the analog output signal is generated by combining the amplified error signal with a signal derived from the second analog signal.

Since the shown embodiment of the second aspect of the invention very closely relates to the shown embodiments of the first aspect of the invention, the features described in detailed with regard to the embodiments of the first aspect of the invention are also relevant to the embodiment of the second embodiment of the invention shown here. They can readily be combined with the features of the embodiment of the second aspect of the invention.

Results

Figure 4:
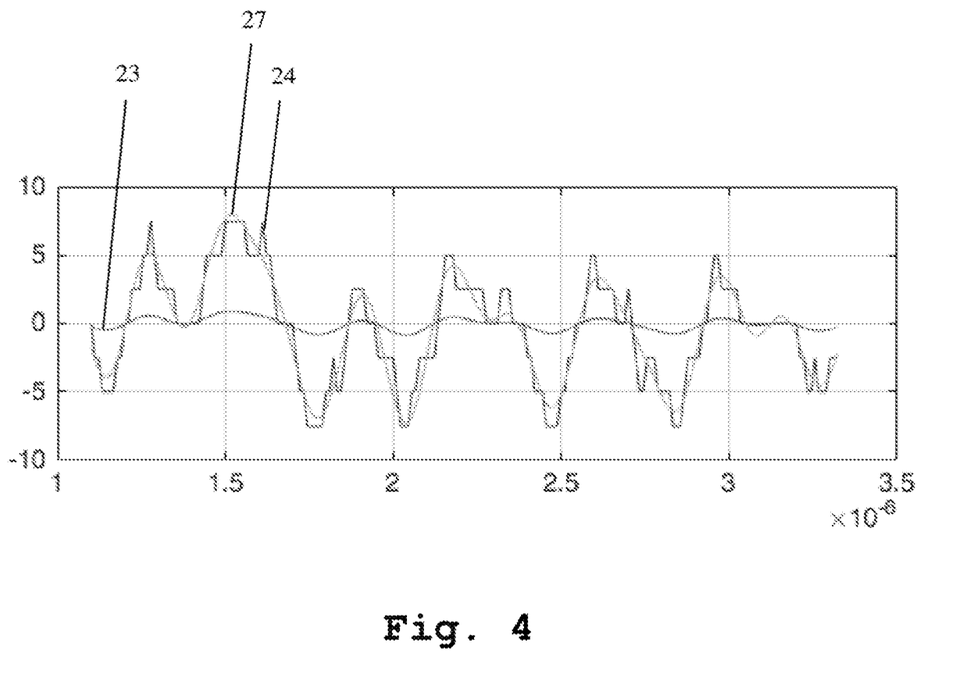
FIG. 4 shows different signals of example results, in the time domain, from a device for converting a digital input signal into an analog output signal, in accordance with example embodiments of the present invention.

In FIG. 4, different signals of example results, in the time domain, from a device for converting a digital input signal into an analog output signal, are shown. Especially here, the second analog signal 24, the amplified error signal 23 and the resulting analog output signal 27 are shown. It can be readily seen that the second analog signal 24 comprises a great amount of error, which clearly can be seen from the discontinuities of the signal. Also in this FIG. 4, it can be readily be seen that the amplified error signal 23 only has a very low amplitude and therefore a very low power. Finally it can be seen from FIG. 4, that by combining the amplified error signal 23 with the second analog signal 24, it is possible to achieve a very high quality analog output signal 27.

Figure 5:
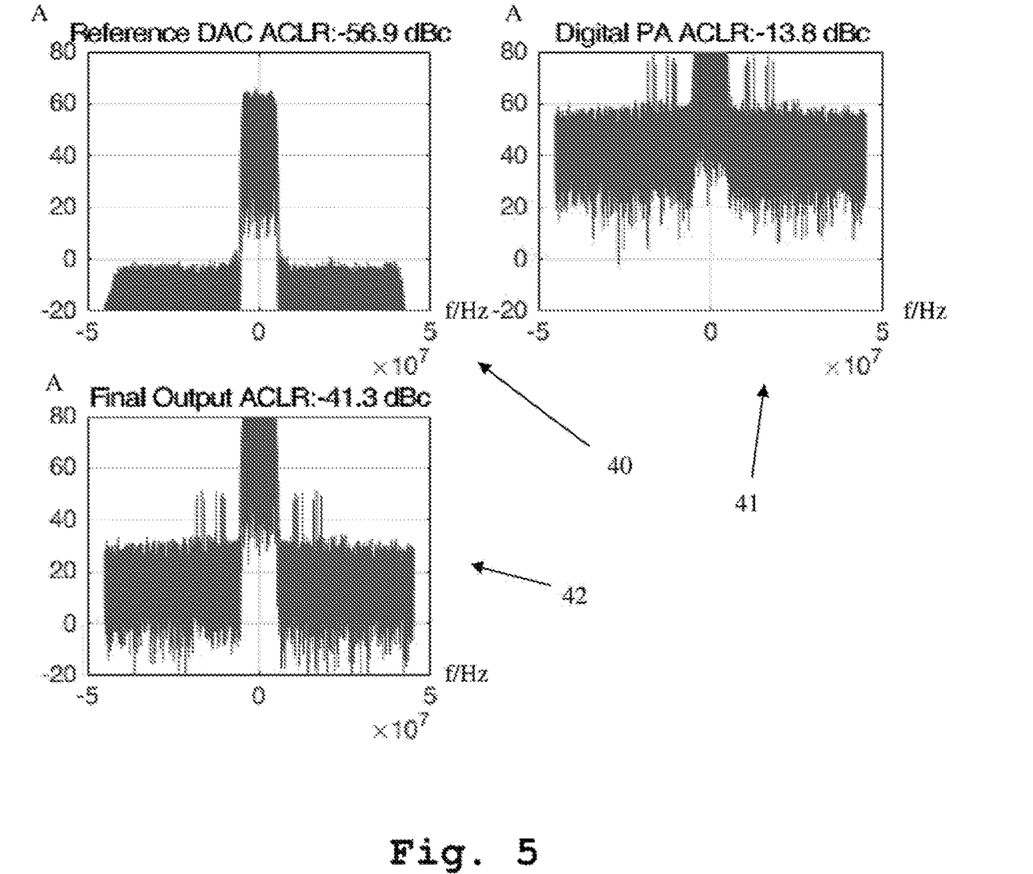
FIG. 5 shows different signals of example results, in the frequency domain, from a device for converting a digital input signal into an analog output signal, in accordance with example embodiments of the present invention.

In FIG. 5, spectral representations of a number of signals of example results, in the frequency domain, from a device for converting a digital input signal into an analog output signal, are shown. Diagram 40 of FIG. 5 shows a spectral representation of the first analog signal 21. Diagram 41 shows a spectral representation of the second analog signal 24. Finally, diagram 42 shows a spectral representation of the analog output signal 27.

Diagram 40 clearly shows that the first analog signal 21 has a very smooth spectral envelope and a very low amount of errors, which can be seen from the lack of spikes. Diagram 41 clearly shows a great amount of errors due to the high distortion of the second digital to analog converter 14. Diagram 42 clearly shows that the amount of errors with regard to diagram 41 has been significantly reduced.

The embodiments of the present invention can be implemented by hardware, software, or any combination thereof. Various embodiments of the present invention may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, or the like.

Various embodiments of the present invention may also be implemented in the form of software modules, processes, functions, or the like which perform the features or operations described above. Software code can be stored in a memory unit so that it can be executed by a processor. The memory unit may be located inside or outside the processor and can communicate date with the processor through a variety of known means.

The invention is not limited to the examples, and not to specify types of converters or signals. The invention discussed above can be applied to many converters and signal types. The characteristics of the exemplary embodiments can be used in any advantageous combination.

Although the present invention and its advantages have been described in detail, it should be understood, that various changes, substitutions and alterations can be made herein without departing from the spirit and scope of the invention as defined by the appended claims.

What is claimed is:

1. A device for converting a digital input signal into an analog output signal, comprising:
   a first digital to analog converter configured to generate a first analog signal from the digital input signal;
   a second digital to analog converter configured to generate a second analog signal from the digital input signal;
   a signal splitter configured to couple out a feedback signal from the second analog signal, wherein the feedback signal has a lower power with regard to the second analog signal;
   a first signal combiner configured to generate an error signal by subtracting the feedback signal from the first analog signal;
   a phase aligner configured to adjust a phase of the error signal; and
   an amplitude aligner configured to adjust an amplitude of the error signal or a signal derived from the error signal; and
   wherein the second digital to analog converter is configured to operate at a higher output power than the first digital to analog converter,
   wherein the first digital to analog converter is configured to be inefficient but accurate and the second digital to analog converter is configured as being efficient but error-prone,
   wherein the efficient but error-prone second digital to analog converter is configured for generating a bulk of the analog output signal and the inefficient but accurate first digital to analog converter is configured for correcting errors to generate the analog output signal with a high efficiency, high power and high quality,
   wherein a power ratio of 1% of the second analog signal is present within the feedback signal, and
   wherein the second digital to analog converter is a one-bit switched converter.

2. The device according to claim 1, further comprising:
   an amplifier configured to amplify the error signal, resulting in an amplified error signal; and
   a second signal combiner configured to combine the amplified error signal and a signal derived from the second analog signal, resulting in the analog output signal.

3. The device according to claim 1, wherein the second digital to analog converter has one or more of a higher noise level and a higher distortion level than the first digital to analog converter.

4. The device according to claim 2, wherein the second signal combiner is configured to combine the amplified error signal and the signal derived from the second analog signal, so as to cancel out errors present in the signal derived from the second analog signal.

5. The device according to claim 2, comprising one or more of the following configurations:
   the first signal combiner is a first directional coupler;
   the signal splitter is a second directional coupler; and
   the second signal combiner is a third directional coupler.

6. The device according to claim 1, wherein a remaining second analog signal remains after the coupling out of the feedback signal from the second analog signal, and wherein the device further comprises:
   a delay element configured to delay the remaining second analog signal, resulting in a delayed signal; and
   wherein the signal derived from the second analog signal is the delayed signal.

7. The device according to claim 6, comprising one or more of the following configurations:
   the delay element is a bandpass filter or a transmission line or a cable; and
   wherein the delay of the delay element is adjusted to be identical to a delay of the amplified error signal with regard to the first analog signal.

8. The device according to claim 1, wherein the first digital to analog converter is a digital predistortion converter or a Doherty converter.

9. The device according to claim 1, wherein the second digital to analog converter is a sigma-delta modulator.

10. The device according to claim 1, wherein the digital input signal is a digital baseband signal or a modulated data stream.

11. A method for converting a digital input signal into an analog output signal, comprising:
   generating, by a first digital to analog converter, a first analog signal from the digital input signal;
   generating, by a second digital to analog converter, a second analog signal from the digital input signal;
   coupling out a feedback signal from the second analog signal, wherein the feedback signal has a lower power with regard to the second analog signal;
   generating an error signal by subtracting the feedback signal from the first analog signal;
   adjusting a phase of the error signal by a phase aligner; and
   adjusting an amplitude of the error signal or a signal derived from the error signal by an amplitude aligner; and
   wherein the second digital to analog converter operates at a higher output power than the first digital to analog converter,
   wherein the first digital to analog converter is inefficient but accurate and the second digital to analog converter is efficient but error-prone,
   wherein the efficient but error-prone second digital to analog converter generates a bulk of the analog output signal and the inefficient but accurate first digital to analog converter corrects errors to generate the analog output signal with a high efficiency, high power and high quality,
   wherein a power ratio of 1% of the second analog signal is present within the feedback signal, and wherein the second digital to analog converter is a one-bit switched converter.

12. The method according to claim 11, further comprising:
amplifying the error signal, resulting in an amplified error signal; and
combining the amplified error signal and a signal derived from the second analog signal, resulting in the analog output signal.

13. The method according to claim 11, wherein the second digital to analog converter has one or more of a higher noise level and a higher distortion level than the first digital to analog converter.

14. The method according to claim 12, wherein the amplified error signal and the signal derived from the second analog signal are combined so as to cancel out errors present in the signal derived from the second analog signal.

15. The method according to claim 11, wherein a remaining second analog signal remains after coupling out the feedback signal from the second analog signal, and wherein the method further comprises:
delaying the remaining second analog signal, resulting in a delayed signal; and
wherein the signal derived from the second analog signal is the delayed signal.

16. The method according to claim 15, further comprising:
adjusting the delay of the remaining second analog signal to be identical to a delay of the amplified error signal with regard to the first analog signal.

17. The method according to claim 11, wherein the digital input signal is a digital baseband signal or a modulated data stream.

* * * * *